United States Patent
Lee et al.

(10) Patent No.: US 9,306,187 B2
(45) Date of Patent: Apr. 5, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventors: Jae-Sun Lee, Yongin (KR); Ung-Soo Lee, Yongin (KR); Sang-Young Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/085,590

(22) Filed: Nov. 20, 2013

(65) Prior Publication Data

US 2014/0319481 A1     Oct. 30, 2014

(30) Foreign Application Priority Data

Apr. 30, 2013   (KR) .................. 10-2013-0048503

(51) Int. Cl.
| | | |
|---|---|---|
| H01L 51/56 | (2006.01) | |
| H01L 51/52 | (2006.01) | |
| H01L 27/32 | (2006.01) | |

(52) U.S. Cl.
CPC ........ *H01L 51/5253* (2013.01); *H01L 27/3246* (2013.01); *H01L 27/3283* (2013.01)

(58) Field of Classification Search
CPC ......... H01L 27/15; H01L 51/50; H01L 51/52; H01L 51/56
See application file for complete search history.

(56) References Cited

U.S. PATENT DOCUMENTS

| | | |
|---|---|---|
| 4,314,031 A | 2/1982 | Sanford et al. |
| 7,722,929 B2 | 5/2010 | Aitken et al. |
| 7,829,147 B2 | 11/2010 | Aitken et al. |
| 8,389,983 B2 | 3/2013 | Seo et al. |
| 2003/0146439 A1* | 8/2003 | Yamazaki ........... H01L 27/3246 257/79 |
| 2007/0040501 A1 | 2/2007 | Aitken et al. |
| 2007/0273280 A1* | 11/2007 | Kim .................... H01L 51/5237 313/509 |
| 2009/0121333 A1 | 5/2009 | Aitken et al. |
| 2012/0326143 A1 | 12/2012 | Tsurume et al. |

FOREIGN PATENT DOCUMENTS

| | | |
|---|---|---|
| JP | 2008192384 A | 8/2008 |
| JP | 201330467 A | 2/2013 |
| KR | 10-2004-0039608 A | 5/2004 |
| KR | 1020040071438 A | 8/2004 |
| KR | 10-2010-0068644 A | 6/2010 |
| KR | 1020110067411 A | 6/2011 |

OTHER PUBLICATIONS

Korean Office Action issued by Korean Patent Office on May 16, 2014 in connection with corresponding Korean Patent Application No. 10-2013-0048503 and Request for Entry of the Accompanying Office Action attached herewith.
Korean Office Action issued by Korean Patent Office on Nov. 26, 2014 in connection with corresponding Korean Patent Application No. 10-2013-0048503 and Request for Entry of the Accompanying Office Action attached herewith.

\* cited by examiner

*Primary Examiner* — Fernando L Toledo
*Assistant Examiner* — Lawrence-Linh T Nguyen
(74) *Attorney, Agent, or Firm* — Robert E. Bushnell, Esq.

(57) ABSTRACT

Provided is an organic light-emitting display device for forming a strong sealing structure. The organic light-emitting display device includes: a lower electrode that is disposed on a substrate; a first barrier wall that protrudes beyond a top surface of the lower electrode; and a second barrier wall that is disposed on at least a top surface of the first barrier wall and has a cross-section having a reverse-tapered shape, wherein the second barrier wall includes a low temperature viscosity transition (LVT) inorganic material including tin oxide.

23 Claims, 5 Drawing Sheets

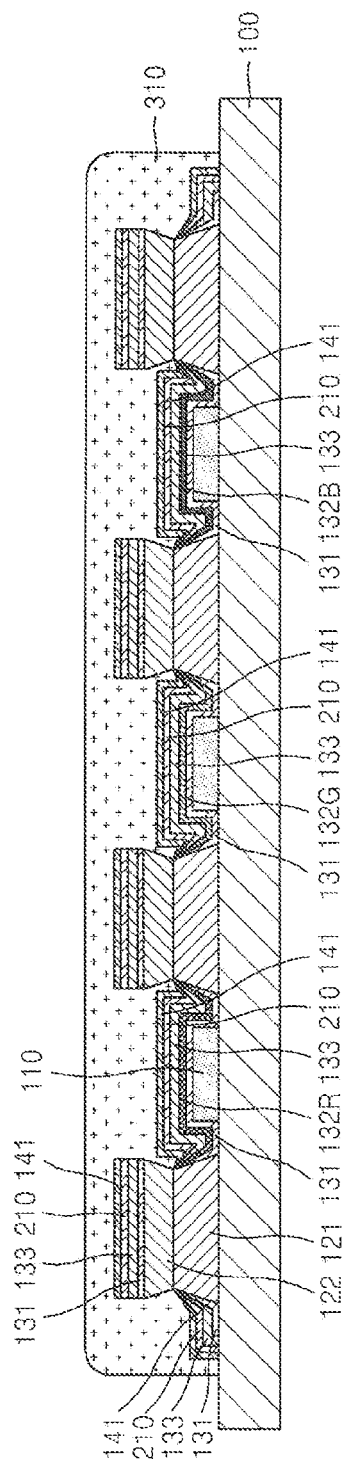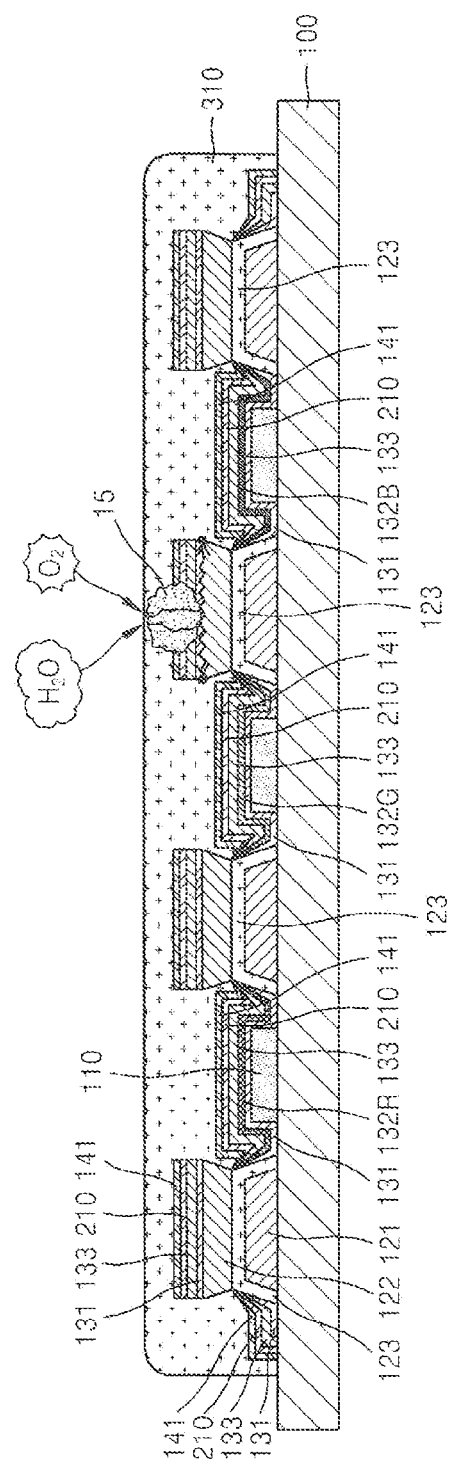

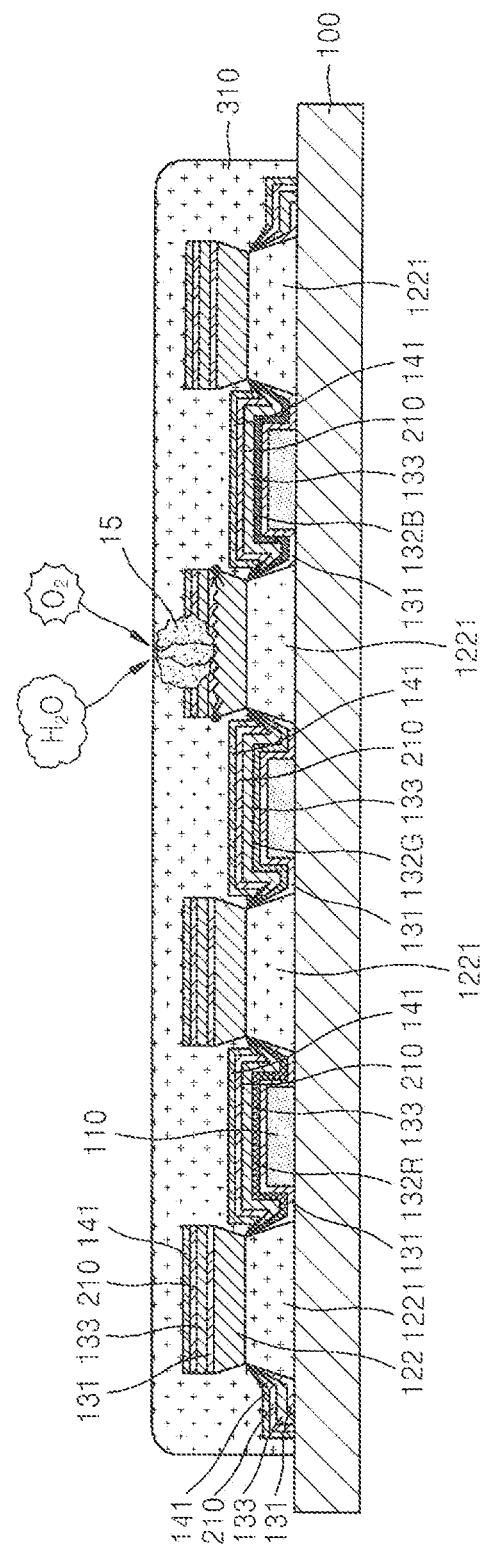

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY DEVICE AND METHOD OF MANUFACTURING THE SAME earlier filed in the Korean Intellectual Property Office on 30 Apr. 2013 and there duly assigned Serial No. 10-2013-0048503.

BACKGROUND OF THE INVENTION

1. Field of the Invention

Embodiments relate to an organic light-emitting display device including a thin film encapsulation unit and a method of manufacturing the organic light-emitting display device.

2. Description of the Related Art

An organic light-emitting display device which is a self-emissive device has advantages of a wide viewing angle, significant contrast is obtained, response time is fast, and luminance, driving voltage, and response speed characteristics are excellent. Furthermore, multi-color display is possible.

An organic light-emitting display device may include an organic light-emitting element. However, since the organic light-emitting element includes an organic material that is easily degraded, the organic light-emitting element is very vulnerable to, for example, oxygen or moisture. Accordingly, there is a well recognized need in the art for a strong sealing structure for sealing the organic light-emitting element from the external environment.

SUMMARY OF THE INVENTION

Embodiments provide an organic light-emitting display device including a strong sealing structure and a method of manufacturing the organic light-emitting display device.

According to an aspect of the invention, there is provided an organic light-emitting display device including: a lower electrode that is provided on a substrate; a first barrier wall that protrudes beyond a top surface of the lower electrode; and a second barrier wall that is provided on at least a top surface of the first barrier wall and has a cross-section having a reverse-tapered shape, wherein the second barrier wall includes a low temperature viscosity transition (LVT) inorganic material including tin oxide.

The organic light-emitting display device may further include: an organic film that is disposed on the top surface of the lower electrode and a top surface of the second barrier wall and is non-continuous along an edge of the second barrier wall; and an upper electrode that is disposed on the organic film and is non-continuous along the edge of the second barrier wall.

The organic light-emitting display device may further include a protective film that is disposed on the upper electrode and is non-continuous along the edge of the second barrier wall.

The organic light-emitting display device may further include a thin film encapsulation unit that is formed over the entire substrate to cover the upper electrode and includes at least one thin film including an inorganic material.

The inorganic material may include the LVT inorganic material including tin oxide.

The organic light-emitting display device may further include a sealing film that surrounds an outer surface of the first barrier wall and includes an inorganic material.

The sealing film may include an LVT inorganic material including tin oxide.

The LVT inorganic material included in the second barrier wall and the LVT inorganic material included in the sealing film may be different from each other.

The first barrier wall may include an LVT inorganic material including tin oxide.

The LVT inorganic material included in the first barrier wall and the LVT inorganic material included in the sealing film may be different from each other.

The first barrier wall and the second barrier wall may be disposed between adjacent lower electrodes.

The first barrier wall and the second barrier wall may be disposed to surround an edge of the lower electrode.

The substrate may include a display area and a peripheral area, wherein the first barrier wall and the second barrier wall are disposed to surround an edge of the display area.

According to another aspect of the embodiment, there is provided a method of manufacturing an organic light-emitting display device, the method including: forming a lower electrode on a substrate; forming a first barrier wall to protrude beyond a top surface of the lower electrode; and forming a second barrier wall having a cross-section having a reverse-tapered shape on at least a top surface of the first barrier wall, wherein the second barrier wall includes a low temperature viscosity transition (LVT) inorganic material including tin oxide.

The method may further include: forming on the top surface of the lower electrode and a top surface of the second barrier wall an inorganic film that is non-continuous along an edge of the second barrier wall; and forming on the organic film an upper electrode that is non-continuous along the edge of the second barrier wall.

The method may further include forming on the upper electrode a protective film that is non-continuous along the edge of the second barrier wall and includes an organic material.

The method may further include forming a thin film encapsulation unit that is formed over the entire substrate to cover the upper electrode and includes at least one thin film including an inorganic material.

The inorganic material may include the LVT inorganic material including tin oxide.

The method may further include forming a sealing film that surrounds an outer surface of the first barrier wall and includes an inorganic material.

The sealing film may include an LVT inorganic material including tin oxide.

The LVT inorganic material included in the second barrier wall and the LVT inorganic material included in the sealing film may be different from each other.

The first barrier wall may include an LVT inorganic material including tin oxide.

The LVT inorganic material included in the first barrier wall and the LVT inorganic material included in the sealing film may be different from each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3 through 6 are cross-sectional views illustrating a method of manufacturing the organic light-emitting display device of FIG. 2, according to an embodiment;

FIG. 7 is a cross-sectional view illustrating an organic light-emitting display device according to another embodiment; and FIG. 8 is a cross-sectional view illustrating an organic light-emitting display device according to another embodiment.

DETAILED DESCRIPTION OF THE INVENTION

Figure 1:
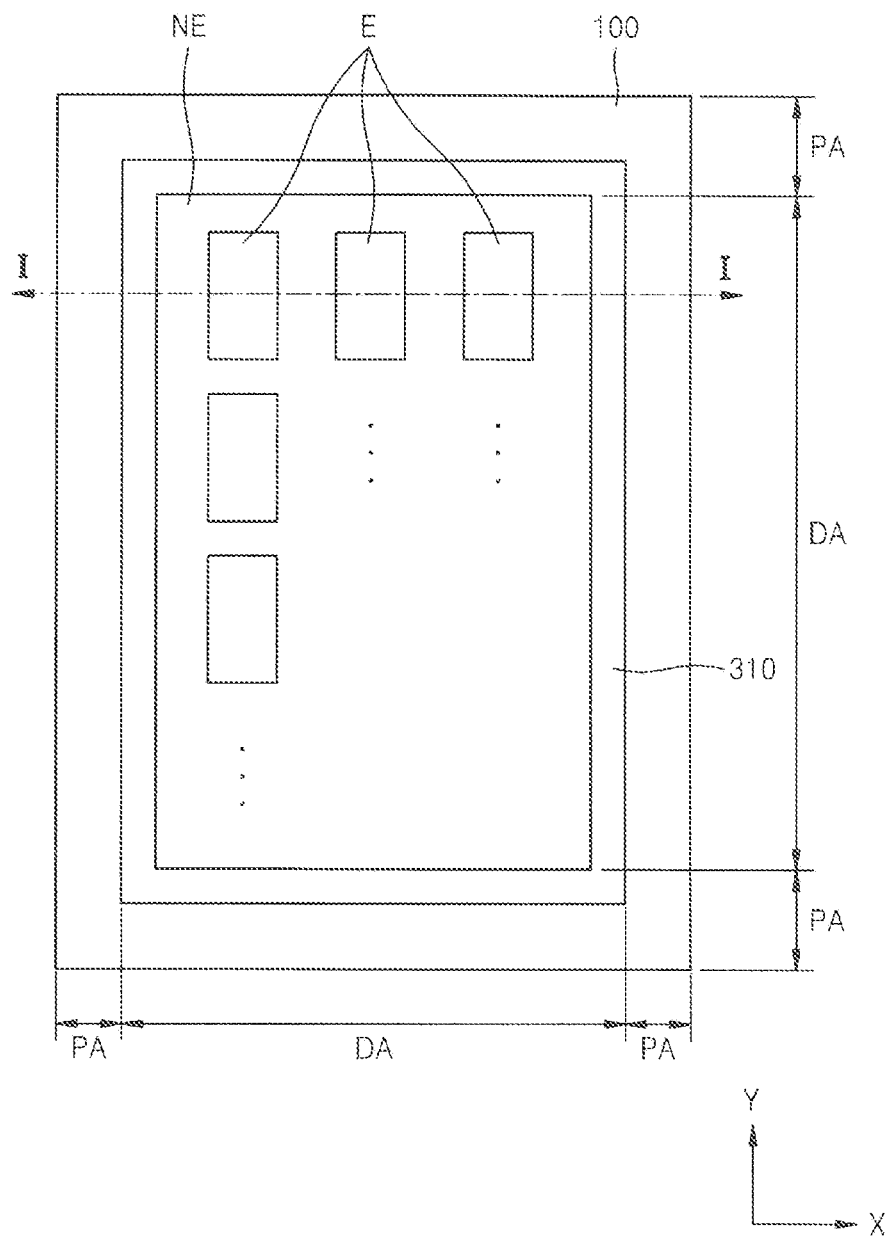
FIG. 1 is a plan view illustrating an organic light-emitting display device according to an embodiment.

As used herein, the term "and/or" includes any and all combinations of one or more of the associated listed items. Expressions such as "at least one of," when preceding a list of elements, modify the entire list of elements and do not modify the individual elements of the list.

Parts in the drawings unrelated to the detailed description are omitted or briefly described to ensure clarity of the embodiments. Also, thicknesses and widths are exaggerated to clearly display various layers and regions in the drawings.

Throughout the specification, the same or corresponding elements are denoted by the same reference numerals. The terms "first," "second," and the like, as used herein do not denote any order, quantity, or importance, but rather are used to distinguish one element from another. It will be understood that when a film, a region, or an element is referred to as being "on" another film, region, or element, it may be directly on the other film, region, or element or intervening films, regions, or elements may be present.

Embodiments will now be described more fully with reference to the accompanying drawings, in which exemplary embodiments are shown.

Figure 2:
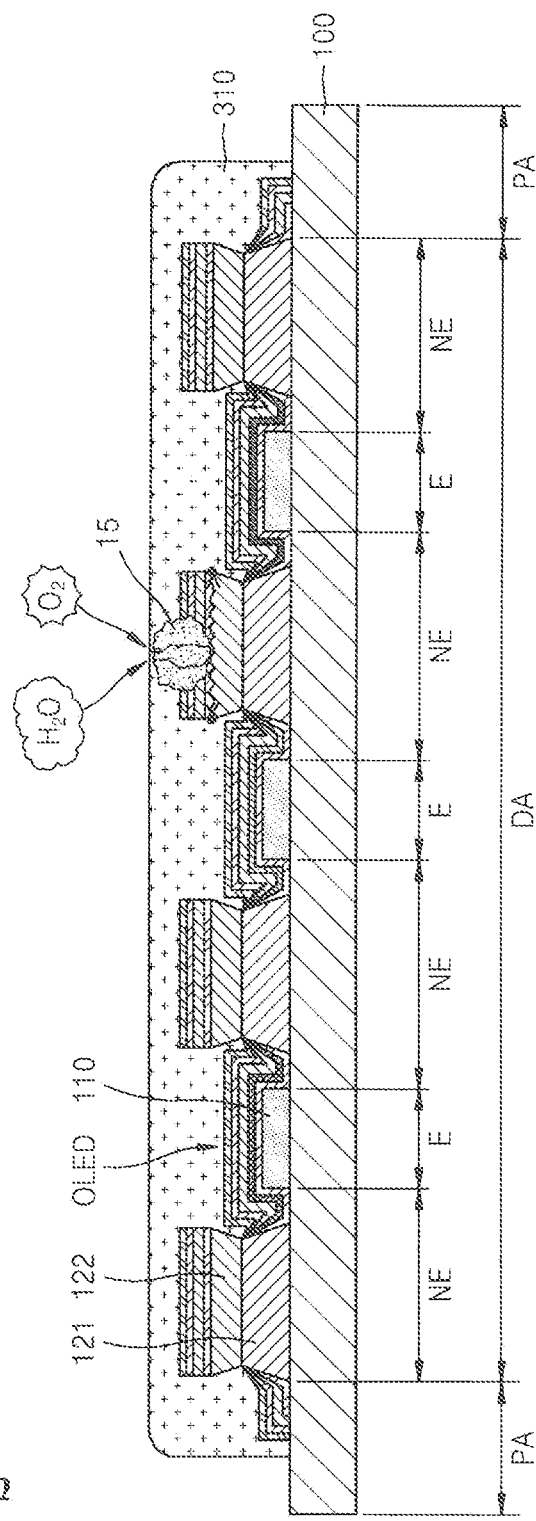
FIG. 2 is a cross-sectional view taken along line I-I of FIG. 1.

FIG. 1 is a plan view illustrating an organic light-emitting display device according to an embodiment. FIG. 2 is a cross-sectional view taken along line I-I of FIG. 1. FIGS. 3 through 6 are cross-sectional views illustrating a method of manufacturing the organic light-emitting display device of FIG. 2, according to an embodiment. A structure of an organic light-emitting display device and a method of manufacturing the organic light-emitting display device according to an embodiment will be explained with reference to FIGS. 1 through 6.

Referring to FIGS. 1 and 2, the organic light-emitting display device includes a substrate 100 that is divided into a display area DA (310) on which an image is displayed, and a peripheral area PA on which an image is not displayed. The display area DA includes emission portions E on each of which an organic light-emitting element OLED is disposed and light is emitted, and a non-emission portion NE on which a barrier wall is disposed and no light is emitted. Electrical elements such as a driver integrated circuit (IC) and an audio component, which are not shown, are disposed on the peripheral area PA.

A structure of the organic light-emitting display device will be explained in detail according to steps of manufacturing the organic light-emitting display device.

First, a substrate 100 is prepared. The substrate 100 may be formed of a transparent plastic or transparent glass material. A substrate 100 may be rigid enough not to be bent or folded in some embodiments. However, a substrate 100 may also be flexible enough to be bent or folded in other embodiments. In this case, the substrate 100 may be formed of a transparent plastic film or a transparent thin film glass.

A buffer layer (not shown) formed of an insulating material may be formed on the substrate 100 to prevent penetration of impurities and planarize a surface of the substrate 100. The buffer layer is not an essential element.

When the organic light-emitting display device is an active organic light-emitting display device, a pixel circuit unit and wires for driving the organic light-emitting element OLED are formed on the buffer layer. The pixel circuit unit may be formed to correspond to each of the emission portions E. The pixel circuit unit includes at least one capacitor and at least two thin film transistors (TFTs) connected to the wires. The pixel circuit unit is electrically connected to the organic light-emitting element OLED. The organic light-emitting element OLED includes a lower electrode 110, an intermediate layer, and an upper electrode 210. In FIG. 2, a structure related to the pixel circuit unit and the wires is omitted and not shown.

When the organic light-emitting display device is a passive organic light-emitting display device, the organic light-emitting element OLED may be formed on the buffer layer. That is, the lower electrode 110, the intermediate layer, and the upper electrode 210 are sequentially formed on the buffer layer.

Figure 3:
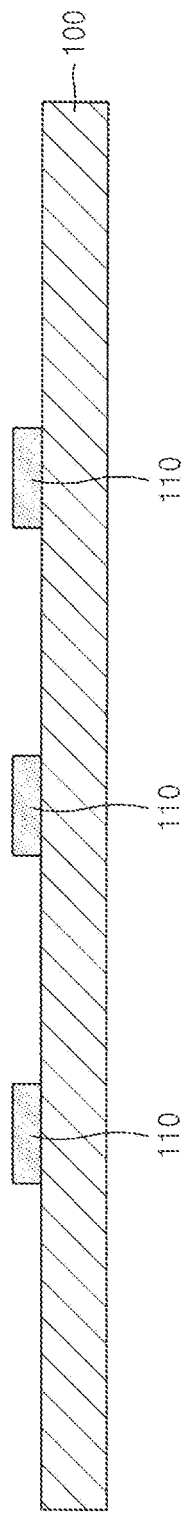

Referring to FIG. 3, the lower electrode 110 is formed on the substrate 100. The lower electrode 110 is formed to correspond in position to each of the emission portions E. The lower electrode 110 may be patterned in an island shape to correspond to each of the emission portions E. However, the present embodiment is not limited thereto. The lower electrode 100 may be formed over the entire substrate 100 to have a planar shape or a linear shape.

Figure 4:
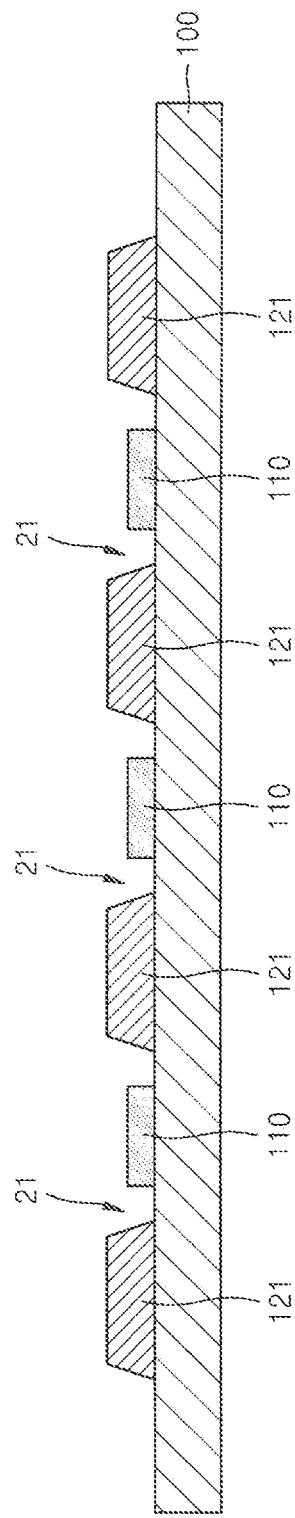

Referring to FIG. 4, a first barrier wall 121 is formed around the lower electrode 110. In detail, an insulating film having a predetermined thickness is formed over the entire substrate 100 to cover the lower electrode 110, and then a first opening 21 is formed in the insulating film through which at least a central portion of the lower electrode 110 is exposed. In FIG. 2, the first opening 21 is formed to completely expose the lower electrode 110. However, the present embodiment is not limited thereto, and the first opening 21 may be formed to cover an edge of the lower electrode 110 and expose the central portion of the lower electrode 110. The first opening 21 defines each of the emission portions E, and a remaining portion of the insulating film becomes the first barrier wall 121. Since the insulating film has a predetermined thickness, the first barrier wall 121 protrudes beyond a top surface of the lower electrode 110.

The first barrier wall 121 is disposed between adjacent lower electrodes 110. Also, the first barrier wall 121 is disposed to surround the edge of the lower electrode 110. As a result, the first barrier wall 121 is disposed between adjacent emission portions E to surround each of the emission portions E. When an organic film is deposited on the lower electrode 110, the first barrier wall 121 prevents an organic material from penetrating into the lower electrode 110 adjacent to the organic film. Also, the first barrier wall 121 is disposed to surround an edge of the display area DA. Accordingly, the first barrier wall 121 also functions to define the display area DA.

The insulating film may be formed of at least one organic insulating material selected from the group consisting of polyimide, polyamide, acrylic resin, benzocyclobutene, and phenolic resin, by using spin coating or the like. Alternatively, the insulating film may be formed of an inorganic insulating material selected from the group consisting of $SiO_2$, $SiN_x$, $Al_2O_3$, $CuO_x$, $Tb_4O_7$, $Y_2O_3$, $Nb_2O_5$, and $Pr_2O_3$. Alternatively, the insulating film may have a multi-layer structure in which an organic insulating material and an inorganic insulating material are alternately stacked. Accordingly, the first barrier wall 121 may be formed of the same material as a material used to form the insulating film.

Figure 5:
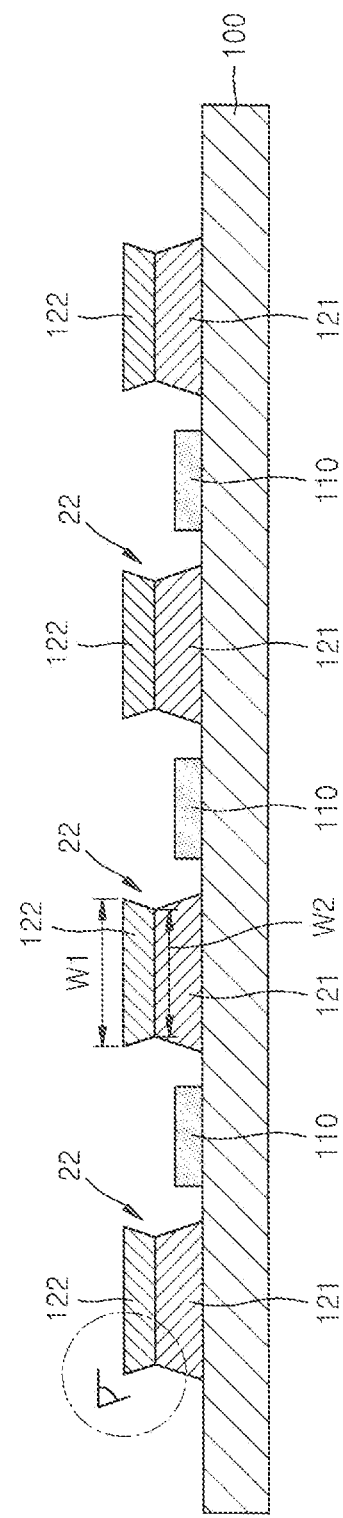

Referring to FIG. 5, next, a second barrier wall 122 is formed on at least a top surface of the first barrier wall 121. In detail, an insulating film having a predetermined thickness is formed over the entire substrate 100 to cover the lower electrode 110 and the first barrier wall 121, and then a second opening 22 through which a central portion of the lower electrode 110 is exposed is formed in the insulating film. The second opening 22 is connected to the first opening 21. The second barrier wall 122 has a cross-section having a reverse-tapered shape. That is, the second barrier wall 122 has a top surface on which an organic film is to be deposited and a bottom surface that contacts the first barrier wall 121. A width W2 of the top surface of the second barrier wall 122 is greater than a width W1 of the bottom surface of the second barrier wall 122.

Since the second barrier wall 122 is formed on the top surface of the first barrier wall 121, the second barrier wall 122 is disposed between adjacent lower electrodes 110, like the first barrier wall 121. Also, the second barrier wall 122 is disposed to surround the edge of the lower electrode 110. Also, the second barrier wall 122 is disposed to surround the edge of the display area DA.

The second barrier wall 122 may be formed of an inorganic material. According to an embodiment, the second barrier wall 122 includes a low temperature viscosity transition (LVT) inorganic material (hereinafter, referred to as an "LVT inorganic material").

The term "viscosity transition temperature" as used herein does not require that the viscosity of the LVT inorganic material completely changes from a "solid" state to a "liquid" state, but also refers to a minimum temperature at which the LVT inorganic material may have some degree of fluidity.

The viscosity transition temperature of the LVT inorganic material may be less than a denaturation temperature of a material included in the display area DA.

The term "denaturation temperature" refers to a temperature at which chemical and/or physical properties of the material included in the display area DA may be changed. For example, the term "denaturation temperature of the material included in the display area" may refer to a glass transition temperature $T_g$ of an organic material included in an organic film 13$b$ of the display area DA. It would be easily understood by one of ordinary skill in the art that the glass transition temperature may be derived as a result of performing, for example, thermal analysis using thermogravimetric analysis (TGA) and differential scanning calorimetry (DSC) ($N_2$ atmosphere, temperature range: room temperature to 600° C. (10° C./min)-TGA and room temperature to 400° C.-DSC, Pan Type: Pt Pan in disposable Al Pan (TGA) and disposable Al pan (DSC)) on a material included in the display area DA. For example, the viscosity transition temperature of the LVT inorganic material may be, but is not limited to, equal to or greater than 80° C., for example, from 80° C. to 130° C. For example, the viscosity transition temperature of the LVT inorganic material may range, but is not limited to, from 80° C. to 120° C. or from 100° C. to 120° C.

The term "reversed-tapered shape" as used herein refers to a shape in which there is a gradual narrowing in a particular direction. The word "tapered" can mean to diminish or reduce or cause to diminish or reduce in thickness toward one end, or to gradually lessen in a certain direction. The term "reverse" would have its usual definition and indicates that the gradual narrowing or reduction in thickness, or the gradual lessening, occurs in a reversed direction.

The term "discontinuous", refers to, for example, a film or electrode, that has at least one break in physical continuity. That is, it has one or more discontinuities.

The LVT inorganic material may be formed of one kind of compound, or a mixture formed of two or more kinds of compounds.

The LVT inorganic material may include tin oxide (for example, SnO or $SnO_2$).

When the LVT inorganic material includes SnO, the SnO content may range from 20 wt % to 100 wt %.

For example, the LVT inorganic material may further include, but is not limited to, at least one of phosphorus oxide (for example, $P_2O_5$), boron phosphate ($BPO_4$), tin fluoride (for example, $SnF_2$), niobium oxide (for example, NbO), and tungsten oxide (for example, $WO_3$).

For example, the LVT inorganic material may include, but is not limited to,

SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$.

For example, the LVT inorganic material may have, but is not limited to, the following compositions:

1) SnO (100 wt %);
2) SnO (80 wt %) and $P_2O_5$ (20 wt %);
3) SnO (90 wt %) and $BPO_4$ (10 wt %);
4) SnO (20-50 wt %), $SnF_2$ (30-60 wt %), and $P_2O_5$ (10-30 wt %) (a sum of weights of SnO, $SnF_2$, and $P_2O_5$ is 100 wt %);
5) SnO (20-50 wt %), $SnF_2$ (30-60 wt %), $P_2O_5$ (10-30 wt %), and NbO (1-5 wt %) (a sum of weights of SnO, $SnF_2$, $P_2O_5$, and NbO is 100 wt %); or
6) SnO (20-50 wt %), $SnF_2$ (30-60 wt %), $P_2O_5$ (10-30 wt %), and $WO_3$ (1-5 wt %) (a sum of weights of SnO, $SnF_2$, $P_2O_5$, and $WO_3$ is 100 wt %).

For example, the LVT inorganic material may include, but is not limited to, SnO (42.5 wt %), $SnF_2$ (40 wt %), $P_2O_5$ (15 wt %), and $WO_3$ (2.5 wt %).

Referring to FIG. 6, an organic film is formed. The organic film includes a first common organic film 131, an organic light-emitting film 132, and a second common organic film 133.

The organic light-emitting film 132 may be separately formed as a color light-emitting portion in each of the emission portions E. For example, referring to FIG. 1, different organic light-emitting films 132R, 132G, and 132B are formed in the emission portions E arranged in a horizontal direction x to emit light of different colors. The same organic light-emitting films 132R are formed in the emission portions E arranged in a vertical direction y to emit light of the same color. Examples of a method of forming the organic light-emitting film 132 include inkjet printing using a nozzle, deposition, evaporation, and thermal transfer using a laser. The organic light-emitting film 132 is formed only on the corresponding emission portion E by using a nozzle or a mask on which a predetermined pattern is formed.

The organic light-emitting film 132 is formed by using a low-molecular weight organic material or a high-molecular weight organic material. For example, the organic light-emitting film 132 may include a host material and a dopant material. Also, the organic light-emitting film 132 may be formed by using a fluorescent material. The organic light-emitting film 132 may emit, but is not limited to, red, green, or blue light.

However, the present embodiment is not limited thereto. The organic light-emitting film 132 may be commonly formed over the entire display area DA. For example, a plurality of the organic light-emitting films 132 emitting red, green, and blue light may be vertically stacked or mixed to emit white light. Of course, a combination of colors for emitting white light is not limited thereto. In this case, a color converting layer or a color filter for changing the emitted white color into light of a predetermined color may be separately provided.

The first common organic film 131 and the second common organic film 133 are disposed between the lower electrode 110 and the upper electrode 210 and facilitate movements of electrons and holes so that the organic light-emitting film 132 emits light. The first common organic film 131 and the second common organic film 133 may be commonly formed over the entire display area DA. The first common organic film 131 and the second common organic film 132 may be formed by using deposition or evaporation.

When the lower electrode 110 functions as an anode and the upper electrode 210 functions as a cathode, the first common organic film 131 includes a hole transport layer (HTL) and a hole injection layer (HIL) sequentially from the organic light-emitting film 132 toward the lower electrode 110. Also, the second common organic film 133 includes an electron transport layer (ETL) and an electron injection layer (EIL) sequentially from the organic light-emitting film 132 toward the upper electrode 210. Of course, the first common organic film 131 and the second common organic film 133 are not limited to include only the aforementioned layers, and may further include an additional layer or may not include some layers according to a type of an organic material including the organic light-emitting film 132.

For example, the HTL may be formed by using (N,N'-Di(naphthalene-1-yl)-N,N'-diphenyl-benzidine (NPB) or Poly(3,4-ethylenedioxythiophene) (PEDOT). The HIL may be formed by using copper phthalocyanine (CuPc), or 4,4',4"-tris(N-(3-methylphenyl)-N-phenylamino)triphenylamine (MTDATA). The ETL may be formed by using a polycyclic hydrocarbon-based derivative, a heterocyclic compound, or tris(8-quinolinolato)aluminum (Alq3). The EIL may be formed by using LiF, Liq, NaF, or Naq.

According to an embodiment, the organic film is formed on the top surface of the lower electrode 110 and the top surface of the second barrier wall 122. However, since the cross-section of the second barrier wall 122 has a reverse-tapered shape, the organic film has a discontinuity along an edge of the first barrier wall 121. For example, when an organic material for forming the first common organic film 131 and the second common organic film 133 is supplied by using deposition in a direction perpendicular to a top surface of the substrate 100, the organic film is deposited only on the top surface of the lower electrode 110 and the top surface of the second barrier wall 122. Accordingly, the organic film is formed to have a discontinuity along the edge of the second barrier wall 122.

Next, the upper electrode 210 is formed on the organic film. The upper electrode 210 may be commonly formed over the entire display area DA to be discontinuous along the edge of the second barrier 1220, like the organic film.

The upper electrode 210 may be formed of a metal, an alloy, an electrically conductive compound, or mixtures thereof. In detail, a reflective, semi-transmissive, or a transmissive electrode may be obtained by forming lithium (Li), magnesium (Mg), aluminum (Al), aluminum-lithium (Al—Li), calcium (Ca), magnesium-indium (Mg—In), or magnesium-silver (Mg—Ag) as a thin film. Various modifications may be made, for example, a transmissive electrode may be formed by using indium tin oxide (ITO) or indium zinc oxide (IZO), to obtain a top emission light-emitting device.

Next, a protective film 141 is further formed on a top surface of the upper electrode 210. The protective film 141 protects the upper electrode 210 from being damaged in a process of forming a first inorganic film 310. When the organic light-emitting display device is a top emission organic light-emitting device in which light is emitted away from the substrate 100, light is emitted toward the upper electrode 210. In this case, in order to improve light extraction efficiency of the organic light-emitting film 132 through refractive index matching, the protective film 141 may be formed by using an organic material having a high refractive index. Also, since the protective film 141 is formed, a flatness of a top surface may be increased.

The protective film 141 may be formed of an organic material. For example, the protective film 141 may be formed of at least one selected from the group consisting of 8-Quinolinolato Lithium (Liq) and tris(8-hydroxy-quinolate)aluminum (Alq3). The protective film 141 may be formed by using resistance heating deposition, sputtering, vacuum deposition, low temperature deposition, electron-beam coating, or ion plating. The protective film 141 may be commonly formed over the entire display area DA. Also, the protective film 141 is formed to be non-continuous along the edge of the second barrier wall 122, like the organic film.

Referring back to FIG. 2, a thin film encapsulation unit is formed over the entire substrate 100 to cover the protective film 141 and seal the display area DA. The thin film encapsulation unit includes at least one inorganic thin film including an inorganic material, which is referred to as the first inorganic film 310.

The first inorganic film 310 includes an LVT inorganic material. The LVT inorganic material included in the first inorganic film 310 and the LVT inorganic material included in the second barrier wall 122 may be the same. Alternatively, the LVT inorganic material included in the first inorganic film 310 and the LVT inorganic material included in the second barrier wall 122 may be different from each other. For example, the LVT inorganic material included in the first inorganic film 310 may include SnO and $P_2O_5$ whereas the LVT inorganic material included in the second barrier wall 122 may include SnO and $BPO_4$. The second barrier wall 122 may include an inorganic material that allows a reverse-tapered shape to be easily achieved, and the first inorganic film 310 may include an inorganic material that allows a thin film to be easily formed.

To form the first inorganic film 310, an LVT inorganic material is provided on the protective film 141, and a pre-inorganic film (not shown) including the LVT inorganic material is formed. Next, a healing process for removing defects in the pre-inorganic film is performed. For example, the healing process may be performed by thermally treating the pre-inorganic film in a range from a viscosity transition temperature of the LVT inorganic material to a denaturation temperature of a material included in the display area DA. Due to the healing process, the LVT inorganic material included in the pre-inorganic film may be fluidized. The fluidized LVT inorganic material may have some degree of flowability. Accordingly, in the healing process, the fluidized LVT inorganic material may flow and fill in a pin hole of the pre-inorganic film, and a film-forming element may flow and fill in the pin hole. As a result, defects of the pre-inorganic film may be removed, and the first inorganic film 310 having dense film quality may be formed.

According to an embodiment, in a process of manufacturing the organic light-emitting display device, an environmental element 15 exists on a surface of the display area DA. The environmental element 15 may be inevitable fine particles which exist or are generated when the display area DA is formed, for example, fine particles introduced from the external environment such as dust in the external environment, or fine particles remaining on an area as a material used to form the display area DA such as fine particles formed of an organic film or upper electrode forming material remaining after the organic film or the upper electrode is formed. The environmental element 15 may include any of various components such as an organic material, inorganic materials, or a combination of organic/inorganic materials. It is substantially impossible to remove environmental element 15 by using well-known methods, for example, wet-etching such as cleaning, after the display area DA is formed.

The following problems occur when the environmental element 15 is located on a protruding portion of the display area DA. When the environmental element 15 is located on the protruding portion of the display area DA and the first inorganic film 310 does not completely seal environmental element 15, external impurities, such as oxygen and moisture, penetrate into the display area DA through the protruding portion on which the environmental element 15 is located. Also, the oxygen and moisture penetrate into the emission portions E through the upper electrode 210, the protective film 141, and the organic film which are commonly formed on the display area DA, thereby degrading the organic light-emitting element OLED. Accordingly, defects such as dark spots or shrinkage occur in the organic light-emitting element OLED.

The problems become severe when the environmental element 15 is located on the protruding portion of the display area DA in a process of forming the organic film or the protective film 141. Since the organic film or the protective film 141 directly contacts the organic light-emitting film 132 located on each of the emission portions E, the oxygen and moisture may be easily directly transmitted to the organic light-emitting film OLED.

Also, when environmental element 15 is located on the protruding portion of the display area DA, a thickness of the first inorganic film 310 is reduced, thereby facilitating penetration of oxygen and moisture. Also, since the non-emission portion NE which is the protruding portion of the display area DA has a large area in the display area DA, the problems become severe when the environmental element 15 is located on the protruding portion of the display area DA.

However, according to an embodiment, since the cross-section of the second barrier wall 122 has a reverse-tapered shape, the second barrier wall 122 blocks paths through which oxygen and moisture penetrate into the emission portions E. That is, since the organic film, the protective film 141, and the upper electrode 210 are formed to be non-continuous along the edge of the second barrier wall 122, paths that connect the top surface of the second barrier wall 122 and the emission portions E are blocked. Accordingly, even when the environmental element 15 is located on the second barrier wall 122 and the oxygen and moisture penetrate, oxygen and moisture are blocked from the emission portions E. As a result, the organic light-emitting element OLED located on each of the emission portions E may be prevented from being degraded.

Also, according to an embodiment, the second barrier wall 122 formed of an inorganic material is further formed on the first barrier wall 121 formed of an organic material. Accordingly, paths through which oxygen and moisture penetrate into the emission portions E through the first barrier wall 121 formed of an organic material from the organic film or the protective film 141 may be blocked.

However, a structure of FIG. 2 may have a problem in that solvent, moisture, and oxygen impregnated in a process of forming the first barrier wall 121 may not be prevented from penetrating into the emission portions E. In particular, when the first barrier wall 121 is formed of an organic material, since solvent, moisture, and oxygen impregnated in the organic material can be more than those impregnated in an inorganic material, the problem becomes severe. To solve the problem, structures of FIGS. 3 and 4 can be used.

FIG. 7 is a cross-sectional view illustrating an organic light-emitting display device according to another embodiment.

The organic light-emitting display device of FIG. 7 is substantially the same as the organic light-emitting display device of FIG. 2 except that the organic light-emitting display device of FIG. 7 further includes a sealing film 123 that surrounds an outer surface of the first barrier wall 121.

The sealing film 123 is formed to completely surround the outer surface including a top surface and a side surface of the first barrier wall 121. The sealing film 123 may be formed after the first barrier wall 121 is formed and before the second barrier wall 122 is formed. The sealing film 123 includes an LVT inorganic material. The LVT inorganic material included in the first inorganic film 310 and the LVT inorganic material included in the sealing film 123 may be the same. Alternatively, the LVT inorganic material included in the first inorganic film 310 and the LVT inorganic material included in the sealing film 123 may be different from each other. For example, the LVT inorganic material included in the first inorganic film 310 may include SnO and $P_2O_5$ whereas the LVT inorganic material included in the sealing film 123 may include SnO, $SnF_2$, and $P_2O_5$.

Since the sealing film 123 that completely surrounds the outer surface of the first barrier wall 121 is formed, solvent, moisture, and oxygen impregnated in the first barrier wall 121 are prevented from penetrating into the emission portions E. Also, in FIG. 7, since the organic light-emitting display device includes the second barrier wall 122 having a cross-section having a reverse-tapered shape, as in FIG. 2, the effects described above with reference to FIG. 2 may be achieved.

FIG. 8 is a cross-sectional view illustrating an organic light-emitting display device according to another embodiment.

The organic light-emitting display device of FIG. 8 is substantially the same as the organic light-emitting display device of FIG. 2 except that a first barrier wall 1221 is formed of an LVT inorganic material including tin oxide, instead of an organic material. The LVT inorganic material included in the first inorganic film 310 of FIG. 8 and the LVT inorganic material included in the first barrier wall 1221 may be the same. Alternatively, the LVT inorganic material included in the first inorganic film 310 and the LVT inorganic material included in the first barrier wall 1221 may be different from each other. For example, the LVT inorganic material included in the first inorganic film 310 may include SnO and $P_2O_5$ whereas the LVT inorganic material included in the first barrier wall 1221 may include SnO and $BPO_4$. The first barrier wall 1221 may include an LVT inorganic material that allows a predetermined thickness to be easily achieved and the first inorganic film 310 may include an LVT inorganic material that allows a thin film to be easily formed.

Although the organic light-emitting display device including the organic light-emitting element is described as a display device, this embodiment may be applied to a flat panel display device having a structure including the first barrier wall 121 and a thin film encapsulation unit.

Although not shown, an organic film formed of an organic material and an inorganic film formed of an inorganic material may be alternately stacked on the first inorganic film 310 to form a thin film encapsulation structure. In this case, the organic film may be formed of a polymer, and preferably, a single film formed of any one of polyehtyleneterephthalate, polyimide, polycarbonate, epoxy, polyethylene, and polyacrylate or a stacked film. An uppermost layer exposed to the outside environment in the thin film encapsulation structure may be formed of an inorganic film to prevent moisture from penetrating into the organic light-emitting element OLED. The thin film encapsulation structure may include at least one structure in which at least one organic film is sandwiched between at least two inorganic films. Also, the thin film encapsulation structure may include at least one structure in which at least one inorganic film is sandwiched between at least two organic films.

For example, the thin film encapsulation structure may include a first organic film and a second inorganic film that are sequentially formed on the first inorganic film 310. Alternatively, the thin film encapsulation structure may include a first organic film, a second inorganic film, a second organic film, and a third inorganic film that are sequentially formed on the first inorganic film 310. Alternatively, the thin film encapsulation structure may include a first organic film, a second inorganic film, a second organic film, a third inorganic film, a third organic film, and a fourth inorganic film that are sequentially formed on the first inorganic film 310. The first organic film may have an area less than that of the second inorganic film, and the second organic film may have an area less than that of the third inorganic film. Also, the first organic film may be completely covered by the second inorganic film, and the second organic film may be completely covered by the third inorganic film.

A sealing substrate adhered by using a sealing member such as a sealant or frit may be further formed on the thin film encapsulation layer, to efficiently seal the organic light-emitting element OLED.

As described above, since an organic light-emitting display device including a strong sealing structure and a method of manufacturing the organic light-emitting display device are provided, an organic light-emitting element may be prevented from being degraded.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic light-emitting display device comprising:
    a lower electrode disposed on a substrate;
    a first barrier wall that protrudes beyond a top surface of the lower electrode; and
    a second barrier wall that is disposed on at least a top surface of the first barrier wall and has a cross-section having a reverse-tapered shape with respect to the first barrier wall,
    wherein the second barrier wall comprises a low temperature viscosity transition (LVT) inorganic material comprising tin oxide.

2. The organic light-emitting display device of claim 1, further comprising:
    an organic film that is disposed on the top surface of the lower electrode, and a top surface of the second barrier wall, that is discontinuous along an edge of the second barrier wall; and
    an upper electrode that is disposed on the organic film that is discontinuous along the edge of the second barrier wall.

3. The organic light-emitting display device of claim 2, further comprising a protective film that is disposed on the upper electrode and that is discontious along the edge of the second barrier wall.

4. The organic light-emitting display device of claim 2, further comprising a thin film encapsulation unit that is disposed over the substrate to cover the upper electrode and comprises at least one thin film comprising an inorganic material.

5. The organic light-emitting display device of claim 4, wherein the inorganic material comprises the LVT inorganic material comprising tin oxide.

6. The organic light-emitting display device of claim 1, further comprising a sealing film that surrounds an outer surface of the first barrier wall and comprises an inorganic material.

7. The organic light-emitting display device of claim 6, wherein the sealing film comprises an LVT inorganic material comprising tin oxide.

8. The organic light-emitting display device of claim 7, wherein the LVT inorganic material included in the second barrier wall and the LVT inorganic material included in the sealing film are different from each other.

9. The organic light-emitting display device of claim 6, wherein the first barrier wall comprises an LVT inorganic material comprising tin oxide.

10. The organic light-emitting display device of claim 9, wherein the LVT inorganic material included in the first barrier wall and the LVT inorganic material included in the sealing film are different from each other.

11. The organic light-emitting display device of claim 1, wherein the first barrier wall and the second barrier wall are disposed between adjacent lower electrodes.

12. The organic light-emitting display device of claim 1, wherein the first barrier wall and the second barrier wall are disposed to surround an edge of the lower electrode.

13. The organic light-emitting display device of claim 1, wherein the substrate comprises a display area and a peripheral area,
    wherein the first barrier wall and the second barrier wall are disposed to surround an edge of the display area.

14. A method of manufacturing an organic light-emitting display device, the method comprising:
    forming a lower electrode on a substrate;
    forming a first barrier wall to protrude beyond a top surface of the lower electrode; and
    forming a second barrier wall having a cross-section having a reverse-tapered shape with respect to the first barrier wall on at least a top surface of the first barrier wall,
    wherein the second barrier wall comprises a low temperature viscosity transition (LVT) inorganic material comprising tin oxide.

15. The method of claim 14, further comprising:
- forming on the top surface of the lower electrode and a top surface of the second barrier wall an inorganic film that is discontinuous along an edge of the second barrier wall; and
- forming on the organic film an upper electrode that is discontinuous along the edge of the second barrier wall.

16. The method of claim 15, further comprising forming on the upper electrode a protective film that is discontinuous along the edge of the second barrier wall and comprises an organic material.

17. The method of claim 15, further comprising forming a thin film encapsulation unit over the entire substrate to cover the upper electrode and comprises at least one thin film comprising an inorganic material.

18. The method of claim 17, wherein the inorganic material comprises the LVT inorganic material comprising tin oxide.

19. The method of claim 14, further comprising forming a sealing film that surrounds an outer surface of the first barrier wall and comprises an inorganic material.

20. The method of claim 19, wherein the sealing film comprises an LVT inorganic material comprising tin oxide.

21. The method of claim 20, wherein the LVT inorganic material included in the second barrier wall and the LVT inorganic material included in the sealing film are different from each other.

22. The method of claim 20, wherein the first barrier wall comprises an LVT inorganic material comprising tin oxide.

23. The method of claim 22, wherein the LVT inorganic material included in the first barrier wall and the LVT inorganic material included in the sealing film are different from each other.

* * * * *